(12) United States Patent
Weekamp et al.

(10) Patent No.: US 7,626,255 B2
(45) Date of Patent: Dec. 1, 2009

(54) DEVICE, SYSTEM AND ELECTRIC ELEMENT

(75) Inventors: Johannus Wilhelmus Weekamp, Eindhoven (NL); Menno Willem Jose Prins, Eindhoven (NL)

(73) Assignee: Koninklijke Philips Electronics N.V., Eindhoven (NL)

(*) Notice: Subject to any disclaimer, the term of this patent is extended or adjusted under 35 U.S.C. 154(b) by 228 days.

(21) Appl. No.: 10/575,573

(22) PCT Filed: Oct. 14, 2004

(86) PCT No.: PCT/IB2004/052089

§ 371 (c)(1),
(2), (4) Date: Apr. 11, 2006

(87) PCT Pub. No.: WO2005/038911

PCT Pub. Date: Apr. 28, 2005

(65) Prior Publication Data

US 2007/0019388 A1    Jan. 25, 2007

(30) Foreign Application Priority Data

Oct. 15, 2003  (EP) ................................. 03103820

(51) Int. Cl.
| | |
|---|---|
| H01L 23/31 | (2006.01) |
| H01L 23/13 | (2006.01) |
| H01L 23/02 | (2006.01) |
| H01L 23/28 | (2006.01) |
| H05K 7/00 | (2006.01) |

(52) U.S. Cl. .............................. 257/690; 257/E23.021; 257/E23.019; 257/E23.124; 257/E23.034; 257/E23.036; 257/E23.041; 257/E23.054; 257/E23.055; 257/E23.14; 257/676; 257/773; 257/673; 361/728; 361/723; 361/813

(58) Field of Classification Search .......... 257/E23.176, 257/E23.021, E23.124, E23.019, E23.034, 257/E23.036, E23.041, E23.054, E23.055, 257/E23.14, 676, 690, 773, 673, 678, 692; 361/728, 723, 813

See application file for complete search history.

(56) References Cited

U.S. PATENT DOCUMENTS

| | | | | |
|---|---|---|---|---|
| 4,996,587 | A | * | 2/1991 | Hinrichsmeyer et al. ..... 257/676 |
| 5,384,689 | A | * | 1/1995 | Shen .......................... 361/761 |

(Continued)

FOREIGN PATENT DOCUMENTS

| | | |
|---|---|---|
| JP | 06204291 | 7/1994 |
| TW | 505616 | 10/2002 |
| WO | WO03085728 A1 | 10/2003 |
| WO | WO03086034 A1 | 10/2003 |

OTHER PUBLICATIONS

Lammerink et al: "Modular Concept for Fluid Handling Systems. A Demonstrator Micro Analysis System"; Micro Electro Mechanical Systems, 1996. An Investigation of Micro Structures, Sensors, Actuators, Machines and Systems. IEEE, The Ninth Annual International Workshop-San Diego, CA, Feb. 11-15, 1996, IEEE, pp. 389-394, XP010159420.

(Continued)

*Primary Examiner*—Alexander O Williams

(57) ABSTRACT

Provided is a device, an assembly comprising said device, a sub-assembly and an element suitable for use in the assembly. The device comprises a body of an electrically insulating material having a first side and an opposite second side, the body being provided with conductors according to a desired pattern, said conductors being anchored in the body. The body is provided with a through-hole extending from the first side to the second side of the body and having a surfacial area which is smaller on the first side than on the second side. Such a device can very suitably be used in an assembly comprising an element which is a sensor, preferably a chemical sensor, and particularly a biosensor.

15 Claims, 5 Drawing Sheets

U.S. PATENT DOCUMENTS

| | | | | |
|---|---|---|---|---|
| 5,477,080 | A * | 12/1995 | Ishisaka et al. | 257/668 |
| 5,530,282 | A * | 6/1996 | Tsuji | 257/666 |
| 5,674,785 | A * | 10/1997 | Akram et al. | 438/15 |
| 5,786,239 | A * | 7/1998 | Ohsawa et al. | 438/123 |
| 5,818,113 | A | 10/1998 | Iseki et al. | |
| 6,013,948 | A * | 1/2000 | Akram et al. | 257/698 |
| 6,605,828 | B1 * | 8/2003 | Schwarzrock et al. | 257/81 |
| 6,806,506 | B2 * | 10/2004 | Tsuji | 257/99 |
| 6,827,586 | B2 * | 12/2004 | Noda et al. | 439/71 |
| 7,001,839 | B2 * | 2/2006 | Fukuzumi | 438/640 |
| 7,221,048 | B2 * | 5/2007 | Daeche et al. | 257/690 |
| 7,425,758 | B2 * | 9/2008 | Corisis et al. | 257/686 |
| 7,436,282 | B2 * | 10/2008 | Whittaker et al. | 336/200 |
| 2002/0086329 | A1 | 7/2002 | Shvets et al. | |
| 2002/0140065 | A1 * | 10/2002 | Paek | 257/673 |
| 2002/0167081 | A1 | 11/2002 | Kondo | |
| 2003/0038376 | A1 * | 2/2003 | Bolken | 257/778 |
| 2003/0052404 | A1 * | 3/2003 | Thomas | 257/693 |
| 2003/0151246 | A1 * | 8/2003 | Baldus et al. | 283/57 |
| 2004/0036081 | A1 * | 2/2004 | Okazaki | 257/99 |
| 2004/0159850 | A1 * | 8/2004 | Takenaka | 257/98 |
| 2005/0093117 | A1 * | 5/2005 | Masuda et al. | 257/676 |
| 2005/0189640 | A1 * | 9/2005 | Grundy et al. | 257/686 |
| 2005/0205979 | A1 * | 9/2005 | Shin et al. | 257/678 |
| 2006/0186536 | A1 * | 8/2006 | Hsu | 257/720 |
| 2007/0284717 | A1 * | 12/2007 | Lien et al. | 257/686 |

OTHER PUBLICATIONS

Kwakye et al: "A Microfluidic Biosensor Based on Nucleic Acid Sequence Recognition"; Analytical Bioanalytical Chemistry (2003), vol. 376, pp. 1062-1068.

Dharmatilleke et al: "Three Dimensional Silicone Device Fabrication and Interconnection Scheme for Microfluidic Applications Using Sacrificial Wax Layers"; Published 2000, New York, NY, ASME, USA.

Coche-Guerente et al: "Amplification of Amperometric Biosensor Responses by Electrochemical Substrate Recycling"; Journal of Electroanalytical Chemistry, vol. 470, pp. 61-69.

ISR of International Application No. PCT/IB2004/05289 Contained in International Publication No. WO2005/038911.

Written Opinion of the International Searching Authority for International Application No. PCT/IB2004/052089.

* cited by examiner

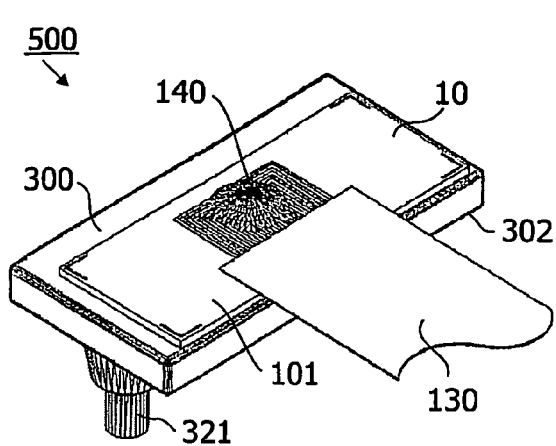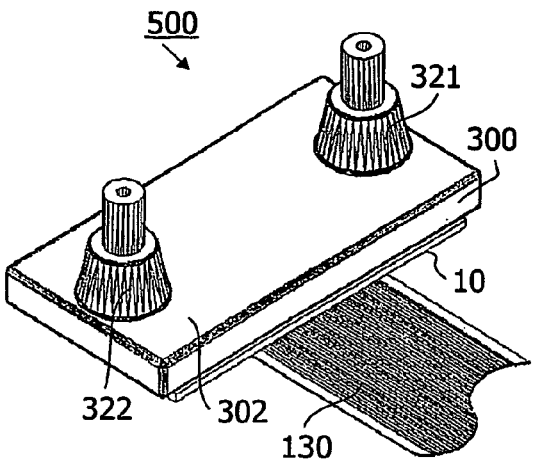
FIG.7A　　　　　FIG.7B
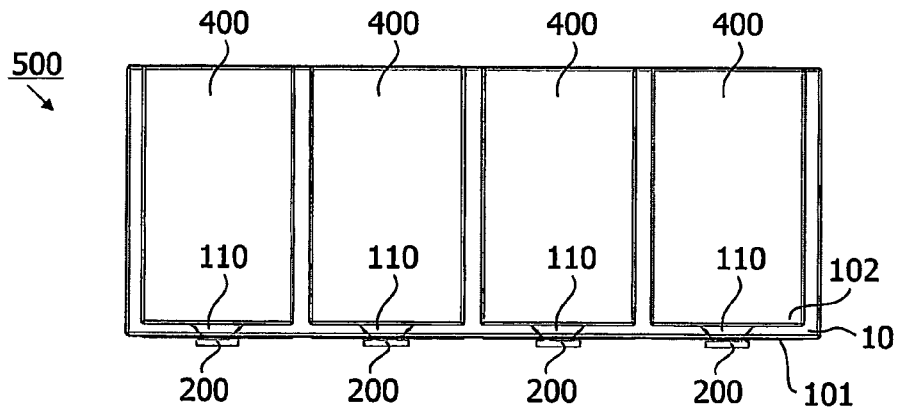
FIG.8
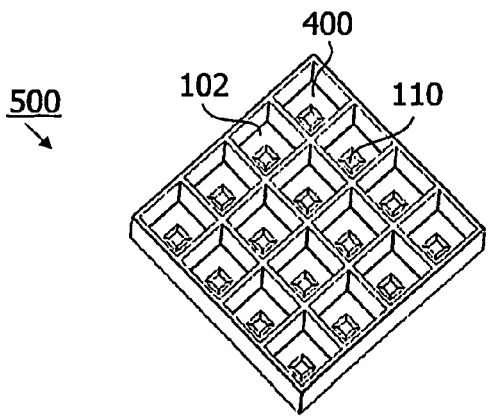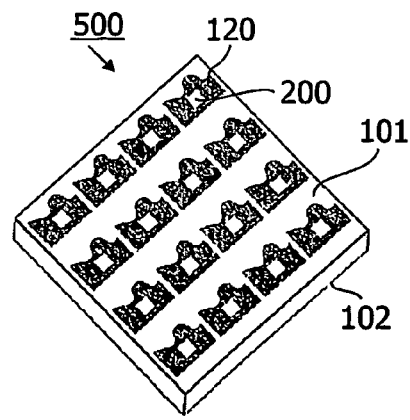
FIG.9A　　　　　FIG.9B

DEVICE, SYSTEM AND ELECTRIC ELEMENT

The invention relates to a device provided with a body of an electrically insulating material having a first side and, opposite thereto, a second side, electric conductors which are anchored in the body being situated on the first side, wherein the body is provided with a recess extending from the first side to the second side.

The invention also relates to an assembly of such a device and an electric element, which electric element is secured to the first side of the device in a manner such that a surface of the element is accessible via the recess in the body.

The invention further relates to an electric element comprising a surface having contact faces and a functional portion.

Such a device, and such an assembly, are described in prepublished patent application US 2005/0514917. The assembly described therein is a camera module comprising, as the electric element, an image-processing semiconductor device (image sensor) and, in addition, a lens provided on the second side of the device. By virtue of the electric conductors anchored in the body, a compact device is obtained. Said body also is the carrier of the lens and the semiconductor device. In addition, the device makes it possible to apply further integration of functionality.

It is an object of the present invention to provide a device of the type described in the opening paragraph, which device is more widely applicable and can be used, in particular, for sensors at a surface of which material has to be applied.

According to the invention, this object is achieved in that a sectional area of the recess on the second side is larger than a sectional area of the recess on the first side of the device. Preferably, the sectional area of the recess in a plane parallel to the first side increases with the distance to the first side. This is not strictly necessary, however, as the recess may alternatively have a first cylindrical portion and a second portion in the shape of a truncated cone.

By virtue of the adapted shape of the section, material can be readily introduced into the recess from the second side, and thus reach a surface on the first side of the device. This is particularly advantageous if the material is supplied in liquid form, vapor form or gas form. Besides the supply of material, the recess can also very suitably be used for the simultaneous removal of material.

It is noted that it is advantageous, yet not necessary, that the surface of the element is directly opposite the first side of the device. It is, for example, not excluded that a spacer of a desired thickness is also provided on the first side, or that a supply device in the form of a hose is present on the first side.

It is further noted that the applicability of the device is not limited to elements used in the supply of material to a surface, such as in particular chemical sensors for household, industrial and, notably, medical applications, although this already implies a large number of possibilities, of which a number will be discussed in more detail herein below.

Sensors used for carrying out measurements on matter present near the surface are manifold. Examples include sensors for gas pressure or air pressure, pH sensors, viscosity sensors, temperature sensors. A related application of this type of sensors is the use as an actuator, for example, to set a liquid into motion. Another related application is the use of the electric element as a processing unit, for example, to separate substances, selectively bind substances or selectively release or repel substances.

An interesting class of chemical sensors for medical applications is formed by biosensors. These sensors are provided, for example, with receptor molecules at the surface. By the choice of the receptor molecules, proteins, amino acids, DNA or other desired properties can be determined. It is also possible to carry out measurements on biological cells. To carry out measurements, these receptor molecules or the acceptor molecules present in the liquid are customarily labeled in a manner known per se to those skilled in the art. By virtue of said label, which can be read, for example, optically or magnetically, the molecule type and/or the concentration thereof can be measured. Particularly favorable results are obtained using magnetic labels in conjunction with sensors comprising magneto-resistance elements.

Other fields of application of the element are those where optical or electromagnetic radiation or vibratory waves must be removed from or brought to a surface. A first example of such fields of application includes light-emitting devices, in particular lamps on the basis of light-emitting diodes (LEDs), wherein the light propagation from the diode can be forward-directed as well as laterally directed. The device may also be used for light-receiving or light-detecting devices, wherein as much light as possible should be captured. In addition, the device can be advantageously used in conjunction with acoustic elements, such as a loudspeaker or a microphone. Even for elements that pick up fields, such as magnetic sensors, it may be advantageous to have a direct path from the element to the second side of the device, while the device simultaneously takes care of removal and supply of electric signals and energy and is also used as a carrier. By virtue of the, preferably mechanical, anchoring of the conductors, they are firmly fixed in the body, unlike non-anchored conductors. This additionally enables the conductors to be embodied such that their resolution is sufficiently high that they can be used in combination with advanced elements having a plurality of contact faces.

It is further noted that the device does not necessarily comprise a single recess and is not necessarily suitable for a single function, but rather may combine a plurality of functions. This also applies to the field of application of the chemical sensors and biosensors. An example is referred to by the inventors as a microtiter plate. In this case the device comprises a plurality of parallel-arranged recesses, and this device can suitably be used for a corresponding number of electric elements. Subsequently, on the second side of the device, a series of channels are provided in a direction that is preferably substantially perpendicular to said second side. Customarily, there is one channel for each recess and each element. This channel structure may be integrated in the device or attached to it as a separate part.

In a favorable embodiment, a number of electric conductors comprise interconnect portions and bonding pad portions, which bonding pad portions have a larger diameter than the interconnect portions and are ordered such that they are suitable for electric coupling with an electric element arranged on the first side. In this embodiment it is possible to place the electric element directly on the first side and connect it both electrically and mechanically to the device. Various connecting techniques known from the field of assembly of semiconductor elements can be used for this purpose, such as wire bonding, flip-chip placement using metal balls, the use of anisotropically conductive adhesive or even the use of a plurality of conductive particles or compounds that can be locally provided. In this respect it is noted that the element can be connected without previously encapsulating the element and attaching it to a leadframe. That is to say, the element can be placed on the device as a "naked die".

In a favorable modification, the bonding pad portions of the conductors are arranged in at least a circle around the recess, in such a manner that the electric element can be attached in a flip-chip orientation to the bonding pad portions by means of connecting means. This has the advantage that both the functional part of the element and the contact faces may be situated at the same surface. Elements which are more complex than passive components presently often comprise six or more contacts and are preferably manufactured on a large plate or a wafer. For said manufacture it is very advantageous if the contacts are present on an upper side. As the lower side only has a carrier function, the functionality will preferably be accessible also via the upper side for the same reason. Suitable materials for the carrier are, inter alia, silicon and glass.

In a further embodiment the recess is trapezoidal. This seemingly generates optimum properties for the flow behavior.

In a further advantageous embodiment, a further electric element is embedded in the body, which element is electrically coupled to a number of the electric conductors. By embedding further electric elements in the body, the compactness of the assembly can be further increased. In addition, the further elements are thus immediately shielded from the material flowing at the surface. Besides, the distances to the electric element are short, which enhances signal integrity and reduces electric losses. This applies in particular if the devices are used at higher frequencies. Examples of further electric elements are, first of all, passive elements. Furthermore, if the electric element is a sensor, it is favorable to accommodate a signal-processing unit, customarily an integrated circuit, in the body. In addition, means for signal and energy transfer or supply may be present in the body. Examples of such means are connectors, antennae, amplifiers, photodiodes for optical communication, batteries and further associated electronics as known to those skilled in the art. Like coils, the antennae may be integrated in the pattern of electric conductors.

For various applications it is advantageous if the electric conductors extend in a number of directions and, in particular, are present also on the second side of the device. This can be achieved through the mode of their manufacture. For the manufacture of the device use is made of a carrier with a sacrificial layer. The electric conductors are present on the sacrificial layer. Conductors having an upper layer and a lower layer are manufactured by means of an etch process or a plating process. The manufacture takes place such that the diameter of the conductors in the lower layer is smaller than that of those in the upper layer. As a result, the upper layer is mechanically anchored in the electrically insulating material of the body, which material is preferably provided by means of an injection molding process (insert molding or transfer molding). Subsequently, the sacrificial layer is at least partly removed.

In particular before the electrically insulating material is provided, electric elements may be provided and electrically connected to the conductors. In addition, the carrier can be bent. The body may alternatively be composed of various electrically insulating materials having different elasticity values. For example flexible parts can be incorporated in the body.

A particularly advantageous embodiment of the device is characterized in that the conductors comprise a first, a second and a third layer, the bonding pad portions being present in the third layer, and patterns in the second layer extending parallel to the first side having a smaller section than corresponding patterns in the first layer, and the electrically insulating material extending into cavities between the patterns in the second layer, thereby mechanically anchoring the corresponding patterns in the first layer. A body comprising such conductors composed of at least three layers is known, for example, from U.S. Pat. No. 7,247,938, which is enclosed herein by reference. In said application, the first and the third layer contain copper and the second layer contains, for example, nickel, chrome, aluminum or an aluminum alloy. Advantageously, bonding layers, customarily composed of NiAu or NiPd, are present at the surface of the first and the third layer. If the body does not contain components, a bonding layer at the first layer is not necessary.

In a further embodiment, the body comprises a first part, a second part and a third part. The recess is situated in the first part, and the third part is situated between the first part and the second part. The third part is bent such that the second part extends substantially parallel to the first part. In addition, an electric element can be placed on the second part on the first side, such that a surface of the element is accessible via the recess in the first part. This embodiment has the advantage that the electric element is embedded between the first part and the second part of the device. By virtue thereof, a good stability is achieved without the necessity of providing an encapsulation after the element has been attached to the device. A further advantage resides in that the element has a rear surface which is placed on the second part, whereby the dissipation of heat is enhanced. After all, the pattern of conductors on the first side of the body may readily comprise a heat sink. The bent part can be made available by providing an elastic electrically insulating material in the third part, or by suitably bending the carrier to provide the electrically insulating material.

In yet another or alternative embodiment, the body comprises a first part, a fourth part and a fifth part. The recess is again situated in the first part, and the fifth part is situated between the first part and the fourth part. Said fifth part is bent such that the fourth part extends substantially parallel to the first part. Said first and fourth parts enclose a channel which connects to the recess and is suitable for transporting a fluid.

Particularly for chemical sensors it is usually insufficient to provide an aperture to the sensor; instead it is necessary to adapt the design of carriers to a continuous flow of a fluid, in particular a solution or a dispersion. By the combination of the first and the fourth part, a desired channel pattern can be created in an advantageous manner that is suitable for removal and supply of a fluid.

In the design of the device, consideration must further be taken with adhesion of particles from the solution or dispersion to walls of the channels and the recess. A solution found in this case is the application of surface layers and/or the choice of the electrically insulating material. In principle there are various possibilities. A further improvement is obtained by maintaining the walls of the channels and the recess as smooth as possible. This is achieved by means of a setting of the mold used for providing the insulating material. In addition, the design of the body is preferably optimized such that the number of dead corners or disturbing corners in the channels and the recess is minimized. After all, dead corners allow material to accumulate and are difficult to clean. Disturbing corners hinder the flow, leading to unpredictable behavior of the fluid in the device. On the other hand, it is possible, if necessary, to shape the channel pattern such that some turbulence develops. This can improve the transfer of material to the surface.

The invention also relates to the assembly of the device according to the invention and an electric element. That offers the advantages of simple assembly and good mechanical stability by the use of the device, which is combined with a conductor pattern and a channel pattern, which patterns can be functionally optimized independently of one another.

Preferably, also contact faces are situated at the surface of the element, which contact faces are electrically connected to conductors on the first side of the device by means of connecting means, said contact faces and the portions of the conductors connected thereto being situated opposite each other and being separated from the part of the surface reached via the recess. As a result, the functional surface and the contact faces are situated on the same side of the element. They are separated from each other to preclude disturbing effects. This can be achieved, for example, by providing a ring-shaped surface deformation on the first side of the device. An underfill material that surrounds the connecting means, generally metal balls of copper, an alloy or solder, is stopped there. Such a technique is known per se from U.S. Pat. Nos. 5,818,113 and 6,605,828. Another modification is the provision of a ring-shaped solder joint between ring-shaped bonding pads on both the device and the electric element. A further modification is the provision of a spacer on the device or on the electric element.

In a favorable embodiment, the assembly in accordance with the invention is further provided with a lid on the second side of the device, the lid and the device enclosing a channel that connects to the recess and that is suitable for the transport of a fluid. Instead of the integrated lid in the form of a fourth part of the body, it is alternatively possible to provide a separate lid that performs the same function. This seems to have the advantage that the assembly of lid and device can be separated in a single separating step. By virtue thereof, it becomes possible to manufacture the assembly on a large scale.

In particular, it is also possible that a sub-assembly of the device and said lid is supplied as a semi-finished product. The use of such a sub-assembly has the advantage that the electric element can be provided in the last phase of the manufacturing process. Besides, the element can be adapted as desired without further consequences, provided the number of contact faces remains the same. It is also possible that the processes of adapting the electric element and providing it on the assembly of device and lid is performed by a player in the production chain other than the one carrying out the manufacture of said device and said lid.

In a particularly advantageous embodiment of the assembly, a bulge is provided in the lid opposite the recess in the device. By virtue thereof, the thickness of the liquid layer and hence the flow properties as well as the material supply can be set. By providing such bulb, the flow channel height is lowered. As a result the liquid is pushed into the cavity. This measure increases the flow-resistance in the cavity so that the fluid tends to avoid the cavity for another reason. In order to compensate for this effect the resistance of the flow channel along the cavity is increased too. This can be implemented by decreasing the height of the flow channel along the cavity or by simple narrowing the flow channel. It will be obvious that optimization of the flow channel height and width will achieve the best performance.

The invention further relates to an electric element. According to the invention, this element is provided with a surface having contact faces and a functional portion, said contact faces and said functional portion being mutually separated by a partition. By virtue of this combination, the element is excellently suited for use in the assembly according to the invention. In particular, the element has the advantage that it can suitably be used in conjunction with material supply to the functional portion of the surface, without electric connections extending from the contact faces to a carrier being liable to wear caused by said material supply. In a suitable application, the element is a sensor, such as a chemical sensor, and in particular a biosensor with biomolecules such as proteins or amino acids at the functional surface. Preferably, the contact faces are arranged in at least one circle around the recess. As a result, a layout is obtained which is commonly applied in the semiconductor industry.

These and other aspects of the invention are apparent from and will be elucidated with reference to the embodiment(s) described hereinafter.

Figure 4A:
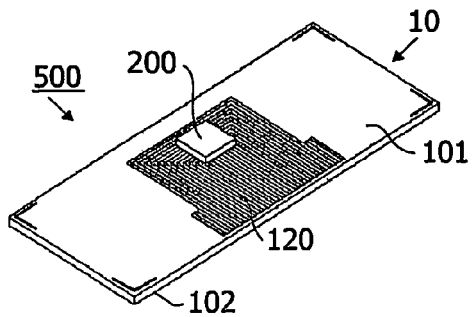
Figure 4B:
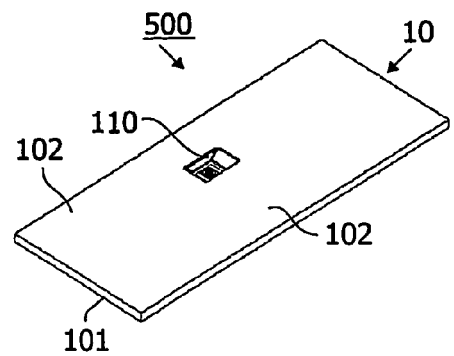
Figure 5A:
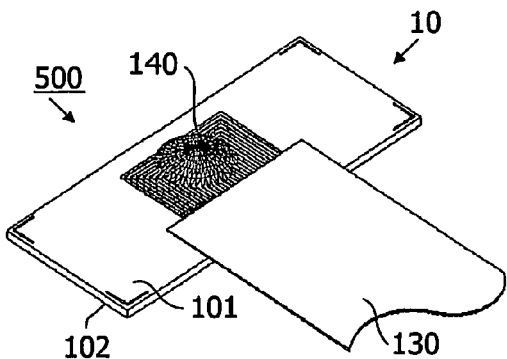
Figure 5B:
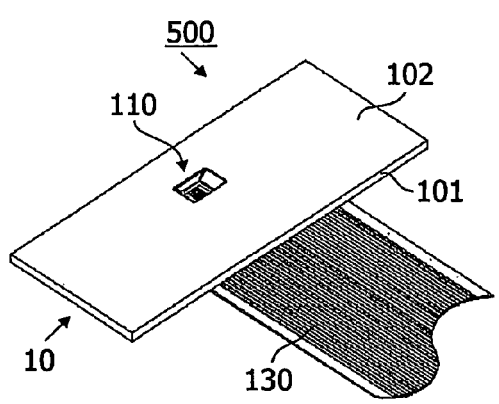
Figure 6A:
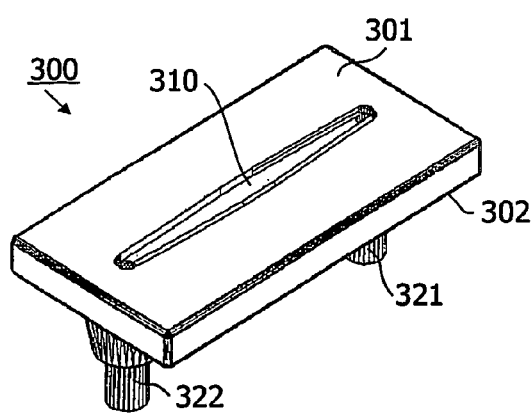
Figure 6B:
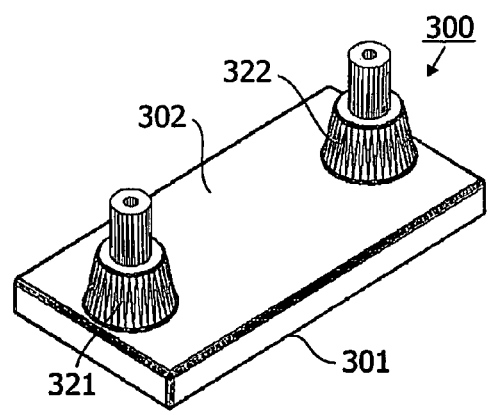
Figure 10:
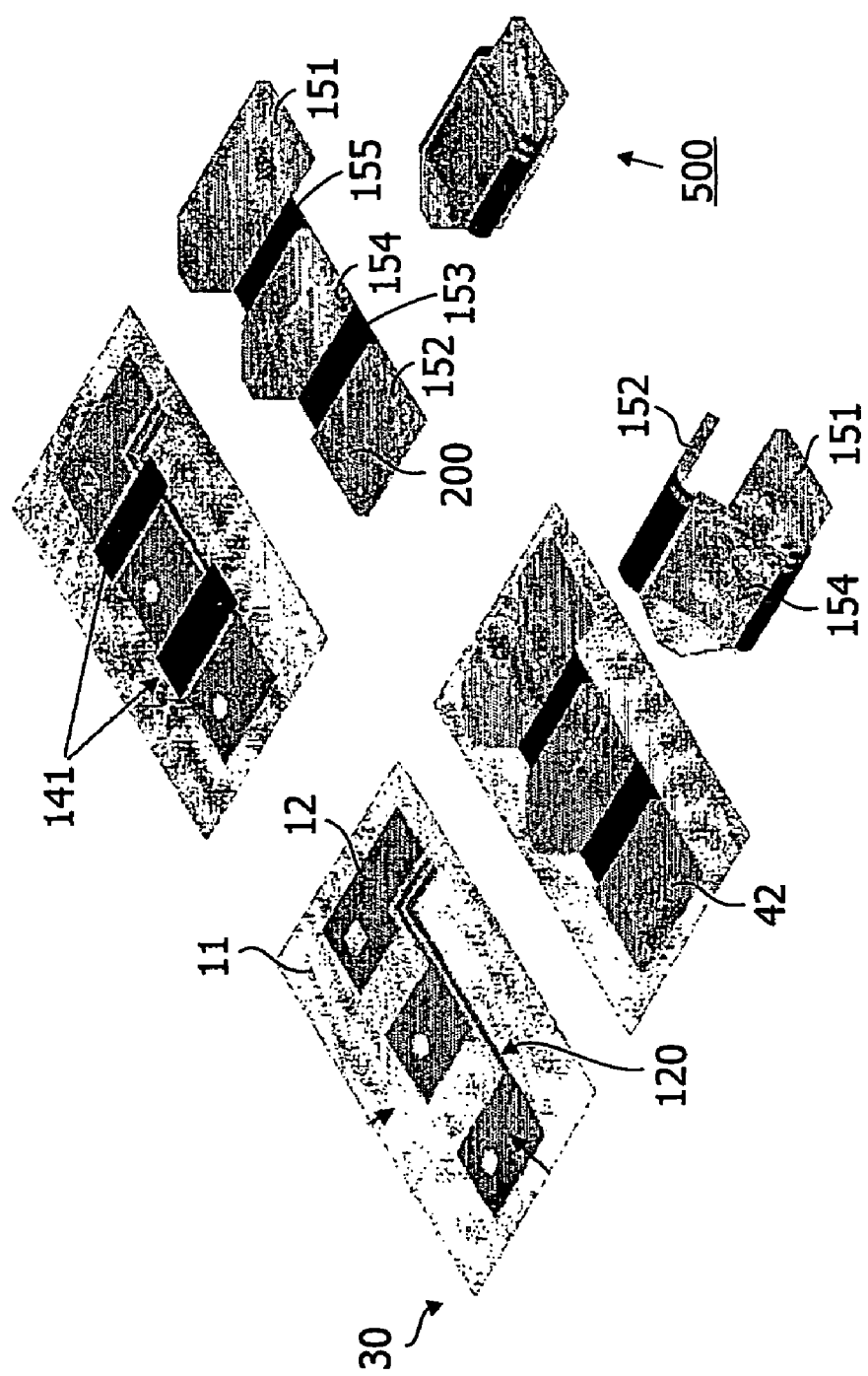

FIGS. 4a and b show the assembly from the first and the second side in bird's eye perspective;

FIGS. 5a and b show the assembly from the first and the second side, in bird's eye perspective, after the application of additional elements;

FIG. 6a shows the lid from a first side in bird's eye perspective;

FIG. 6b shows the lid from an opposite, second side in bird's eye perspective;

FIG. 7a shows the assembly after assembly of lid, device and element, from the first side of the device in bird's eye perspective;

FIG. 7b shows the assembly from the second side of the device;

FIG. 8 is a diagrammatic sectional view of a second embodiment of the assembly;

FIG. 9a shows the embodiment of FIG. 8 in bird's eye perspective from the second side of the device;

FIG. 9b shows this embodiment from the first side of the device;

FIG. 10 shows a number of stages of the manufacture of a third embodiment in accordance with the invention.

The drawings are not to scale and like parts in different drawings are referred to by like reference numerals.

Figure 1:
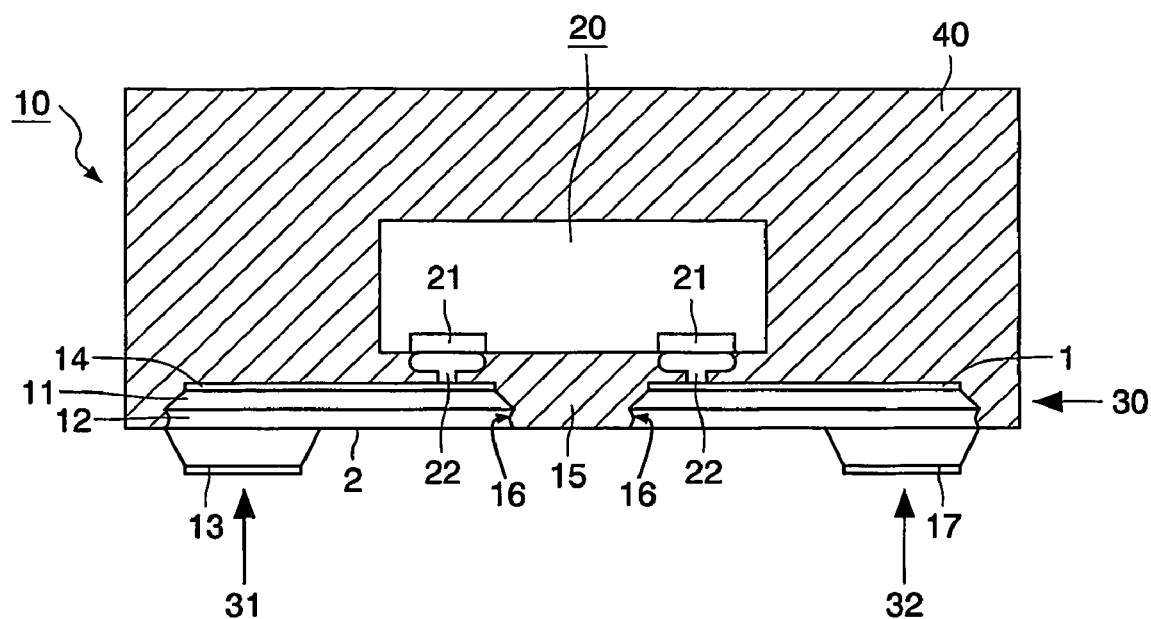
FIG. 1 is a diagrammatic sectional view of the device.

FIG. 1 is a diagrammatic sectional view of a first embodiment of the device 10 comprising, in this example, a semiconductor element 20 which is recessed in the device. This, however, is not necessary. Although not shown in this sectional view, recesses and contacts placed according to the specifications can be readily formed, as will be understood by those skilled in the art.

The device comprises a carrier 30 having a first metal layer 11, an intermediate layer 12, a second metal layer 13. In this example, the first and the second metal layer 11, 13 contain Cu and the intermediate layer contains $Al_{0.99}Si_{0.01}$. The carrier 30 further comprises a first etch mask 14 and a second etch mask 17. The first and the second etch mask 14, 17 each have a bonding layer of NiPdAu. The carrier 30 is patterned from the first side by means of the first etch mask 14, thereby forming apertures 15 and connection conductors 31-35. This was carried out by means of an etching process in which first the first metal layer 11 was etched and subsequently the intermediate layer 12 was etched, thereby forming the recesses 16 in the side faces of the connection conductors 31-35. Subsequently, the semiconductor element 20 having connection regions 21 is connected to the connection conductors 31-35 by connection means 22, in this case bumps of Au. For this purpose use is made of a flip-chip technique. Next, the encapsulation 40 is provided. As said encapsulation 40 extends into the recesses 16 of the carrier, a mechanical anchoring effect is achieved. Subsequently, the second metal layer 13 is patterned by means of the second etch mask 17. This is achieved by placing the device in an etch bath which selectively removes the second metal layer 13 with respect to both the intermediate layer and the second etch mask 17. The apertures 15 are subsequently also used to separate the semiconductor devices 10. This has the additional advantage that said mechanical anchoring causes the connection conductors 31-35 to be substantially encapsulated, that is to say, not only at the location of the semiconductor element 20, but also beyond said semiconductor element. The semiconductor device 10 has, for example, the following measurements: approximately 1 by 1 mm. The aperture 15 has a width of, for example, 40-100 µm. The thicknesses of the first metal layer 11, the intermediate layer 12 and the second metal layer 13 are chosen to be, respectively, 30 µm, 40 µm and 30 µm. Other thicknesses, for example 15 µm, 15 µm and 70 µm are also feasible. Advantageously, a protective layer is present between the contacts 31, 32 to protect the interface of copper and aluminum against delamination.

Figure 2A:
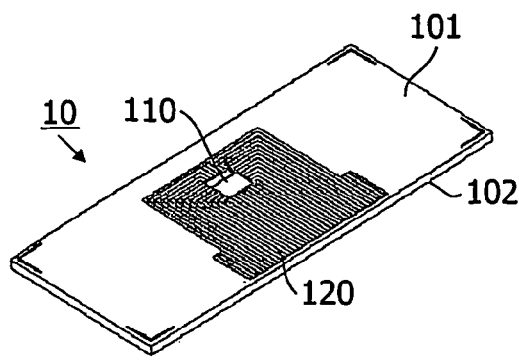
FIG. 2a shows the device from the first side in bird's eye perspective.
Figure 2B:
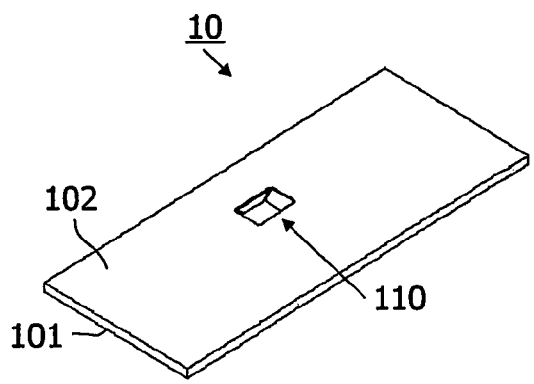
FIG. 2b shows the device from the second side in bird's eye perspective.

FIG. 2a shows, in a bird's eye perspective, the device 10 in accordance with the invention from the first side 101. FIG. 2b shows, in bird's eye perspective, the same device 10 from the second side 102. Tracks 120 are defined in the layers of the carrier 30, as described with reference to FIG. 1. A recess 110 is also formed, which extends from the first side 101 to the opposite, second side 102. As is shown particularly clearly in FIG. 2b, the diameter of the recess 110 decreases from the second side 102 in the direction of the first side 101. In this case, the decrease is monotonous, and the recess 110 is trapezoidal. However, this is not necessary.

Figure 3:
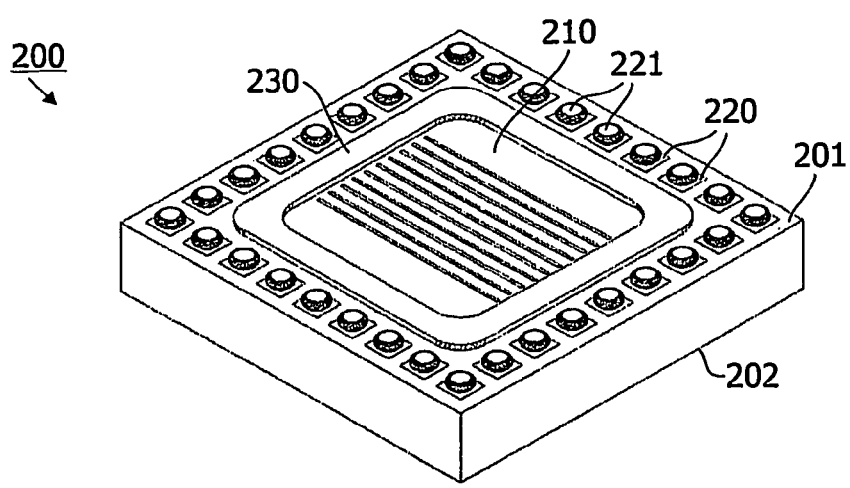
FIG. 3 shows the electric element in bird's eye perspective.

FIG. 3 shows, in a bird's eye perspective, the electric element 200 having a surface 201 and a carrier side 202 facing away from said surface. At the surface 201, the element is provided with a functional area 210 to which, in this case, biological molecules such as amino acids or DNA can be bonded in a manner which is known per se. Adjacent thereto there are contact faces 220 for external contacting. These contact faces 220 are arranged, in this case, in a circle around the functional area 210. If necessary, two or more circles are also possible. Alternatively, the contact faces 220 may be arranged in an array next to the functional area 210. The contact faces are provided with metal or solder balls 221 in a conventional manner. The functional area 210 and the contact faces 220 are; in this case, mutually separated by a partition 230, for example of a polymer material having a thickness similar to that of the solder balls 221. The element 200 is, in this case, an element having a silicon substrate and GMR elements which are incorporated in Wheatstone bridges. The measurements are, for example, 1.4 by 1.4 by 0.3 mm.

FIGS. 4a and b show the assembly 500 from the first side 101 and from the second side 102, respectively, of the device 10, in bird's eye perspective, after the electric element 200 has been attached to the device 10. The surface 201 of the element 200 faces the first side 101 of the device 10. The element 200 is assembled in such a manner that the functional area 210 is accessible via the recess 110 and that the contact faces 220 are connected to the tracks 120 via the solder balls 221.

FIGS. 5a and b show the assembly 500 from the first and the second side 101, 102, respectively, of the device 10, in bird's eye perspective, after the provision of additional elements. The additional elements are a flexfoil 130 for external contacting and a protective layer 140 of an electrically insulating material, which is known by the name of globtop to those skilled in the art. Preferably, the protective layer 140 also comprises an underfill, which surrounds the solder balls 221.

FIG. 6a shows the lid 300 from a first side 301 in bird's eye perspective. FIG. 6b shows, in bird's eye perspective, the same lid 300 from an opposite, second side 302. The lid 300 is provided, in this case, with a channel 310 and with a first and a second connection 321, 322. For assembly and manufacture of the lid 300 use can be made of conventional techniques, such as insert molding.

FIG. 7a shows the assembly 500 after assembly of lid 300, device 10 and element 200, in bird's eye perspective. The drawing shows the assembly 500 from the first side 101 of the device 10. FIG. 7b shows the assembly 500 from the second side 302 of the lid 300. The assembly 500 is a complete biosensor cartridge. To provide the lid 300 on the first side 102 of the device use is made, for example, of an adhesive. The dimensions of the resulting biosensor are, for example, 17 by 10 by 3 mm.

FIG. 8 is a diagrammatic sectional view of a second embodiment of the assembly 500. FIG. 9a shows the same embodiment as FIG. 8, yet in bird's eye perspective from the second side 102 of the device 10. FIG. 9b shows this embodiment from the first side 101 of the device 10. The assembly is referred to by the invention as a microtiter plate. The assembly 500 is provided with a plurality of recesses 110 and corresponding elements 200 and a corresponding plurality of channels 400 extending in a direction substantially perpendicular to the device 10. The structure of the channels 400 is formed, in this case, by means of injection molding. This structure is integrated in the device 10.

FIG. 10 shows a number of stages in the manufacture of a third embodiment of the device 10 according to the invention. The device 10 is provided with a number of parts, i.e. a first part 151, a second part 152, a third part 153, a fourth part 154 and a fifth part 155. The third part and the fifth part 153, 155 are bent. The fourth part 154 serves as the lid, and the second part 152 serves as the carrier of the element 200. In this case, the element 200 is provided on the rear side of the plane of the drawing. In this example there is started from a foil 30 comprising a first layer 11 of copper and a second layer 12 of aluminum. The second layer 12 is slightly etched from the side of the first layer, so that underetching takes place under the tracks 120 in the first layer 11. Upon the provision of flexible material 41 and non-flexible electrically insulating material 42, these tracks 120 are anchored in this material. Subsequently, the second layer 12 is removed, the element 200 is provided and the assembly 500 can be bent and glued so as to obtain the desired final result. By virtue of the continuous copper tracks 120, the wiring for the element 200 can be integrated with coils and a shielding.

The invention has been described with reference to the preferred embodiments. Modifications and alterations will occur to others upon a reading and understanding of the preceding detailed description. It is intended that the invention be construed as including all such modifications and alterations insofar as the come within the scope of the appended claims or the equivalents thereof.

The invention claimed is:
1. An assembly comprising:
device provided with a body of an electrically insulating material having a first side and, opposite thereto, a second side, electric conductors which are mechanically anchored in the body being situated on the first side, the electric conductors comprise first, second, and third layers, wherein the electrically insulating material extends into cavities between patterns in the second layer to mechanically anchor the electric conductors in the body situated on the first side, wherein:

the body is provided with a recess extending completely from the first side to the second side, and a sectional area of the recess on the second side is larger than a sectional area of the recess on the first side of the device; and an electric element, which electric element is attached to the first side of the device in a manner such that a functional portion of a surface of the electric element is accessible via the recess in the body.

2. The assembly as claimed in claim 1, wherein at least a number of electric conductors comprise interconnect portions and bonding pad portions, which bonding pad portions have a larger diameter than the interconnect portions and are ordered such that they are suitable for electric coupling with an electric element arranged on the first side.

3. The assembly as claimed in claim 2, wherein the bonding pad portions of the conductors are arranged in at least a circle around the recess, in such a manner that the electric element can be attached in a flip-chip orientation to the bonding pad portions by means of connecting means.

4. The assembly as claimed in claim 1, wherein the recess is truncated pyramid trapezoidal.

5. The assembly as claimed in claim 1, wherein a further electric element is embedded in the body, which element is electrically coupled to a number of the electric conductors.

6. The assembly as claimed in claim 2, wherein the bonding pad portions being present in the third layer.

7. The assembly as claimed in claim 1, wherein the body comprises a first part, a second part and a third part, wherein the recess is situated in the first part, and the third part is situated between the first part and the second part, and is bent such that the second part extends substantially parallel to the first part, wherein an electric element can be placed on the second part on the first side, such that a functional portion of a surface of the electric element is accessible via the recess in the first part.

8. The assembly as claimed in claim 1, wherein the body comprises a first part, a fourth part and a fifth part, wherein the recess is situated in the first part, and the fifth part is situated between the first part and the fourth part, and is bent such that the fourth part extends substantially parallel to the first part, which first and fourth parts enclose a channel which connects to the recess and is suitable for transporting a fluid.

9. The assembly as claimed in claim 1, wherein the electric element also includes contact faces situated on a same side of the surface of the electric element as the functional portion, which contact faces are electrically connected to conductors on the first side of the device by means of connecting means, said contact faces and the portions of the conductors connected thereto being situated opposite each other and being separated from the functional portion of the surface reached via the recess.

10. The assembly as claimed in claim 1, further provided with a lid on the second side of the device, the lid and the device enclosing a channel which connects to the recess and is suitable for the transport of a fluid.

11. A sub-assembly comprising:
device provided with a body of an electrically insulating material having a first side and, opposite thereto, a second side, electric conductors which are mechanically anchored in the body being situated on the first side, the electric conductors comprise first, second, and third layers, wherein the electrically insulating material extends into cavities between patterns in the second layer to mechanically anchor the electric conductors in the body situated on the first side, wherein:

the body is provided with a recess extending completely from the first side to the second side, and a sectional area of the recess on the second side is larger than a sectional area of the recess on the first side of the device; and an electric element coupled to the first side, such that a functional portion of a surface of the electric element is accessible via the recess, and a lid including a channel extending between first and second connections and coupled to the second side of the device, the lid and the device thereby enclosing the channel which further connects to the recess and which is suitable for the transport of a fluid into the recess between the first and second connections.

12. The sub-assembly as claimed in claim 11, wherein a plurality of individual devices and corresponding lids are present, which can be separated into individual units in a joint separating step.

13. The assembly as claimed in claim 1, wherein a diameter of the recess decreases from the second side in the direction of the first side.

14. The assembly as claimed in claim 1, wherein a diameter of the recess has an enlarged region from which the diameter of the recess decreases toward both the first and second sides.

15. A semiconductor assembly comprising:
a body of electrically insulated material having a top side and, opposite thereto, a bottom side;

a carrier comprising a first layer, a second layer, and a third layer which is provided with a recess completely extending from the top side of the carrier to the bottom side of the carrier, the recess forming electric conductors including a first layer, a second layer and a third layer;

wherein the electrically insulating material extends into cavities between patterns in the second layer to mechanically anchor the electric conductors in the body of electrically insulated material, and the recess is a truncated pyramid with a sectional area of the bottom side of the recess being larger than a sectional area of the top side of the recess; and a semiconductor element which is electrical coupled to the electric conductors and embedded and attached to the top side in a manner such that a functional portion of the electric element is accessible via the recess in the carrier.

* * * * *